(12) United States Patent
Tamura et al.

(10) Patent No.: US 6,769,748 B1
(45) Date of Patent: Aug. 3, 2004

(54) ELECTRONIC DEVICE CABINET

(75) Inventors: Tetsuya Tamura, Tokyo (JP);
Takayuki Okada, Tokyo (JP);
Toshiyuki Miyashita, Tokyo (JP);
Masaharu Hizawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/576,049

(22) Filed: May 23, 2000

(30) Foreign Application Priority Data

May 24, 1999 (JP) .......................................... 11-143295
Mar. 24, 2000 (JP) ....................................... 2000-128586

(51) Int. Cl.[7] .............................................. A47B 97/00
(52) U.S. Cl. ............................... 312/223.2; 312/223.1; 261/428; 361/686
(58) Field of Search ............................ 312/236, 257.1, 312/263, 265.5, 223.1, 223.2, 406.1, 106.2; 261/428, 429; 361/683, 685, 686, 687, 684, 728, 730

(56) References Cited

U.S. PATENT DOCUMENTS 4,444,318 A    4/1984  Alexander
5,564,802 A  * 10/1996  Chiou ................... 312/223.2 X
6,027,191 A  *  2/2000  Korinsky et al. ......... 312/223.2
6,147,859 A  * 11/2000  Abboud ................ 312/223.2 X
6,231,145 B1 *  5/2001  Liu ...................... 312/223.2 X

FOREIGN PATENT DOCUMENTS

DE    87 11 642 U1   12/1987
DE   296 07 138 U1    8/1996
EP     0 695 044 A2   1/1996

* cited by examiner

Primary Examiner—Peter M. Cuomo
Assistant Examiner—Michael J. Fisher
(74) Attorney, Agent, or Firm—Sughrue Mion, PLLC (57) ABSTRACT

An electronic device cabinet is provided which can be made compact and lightweight without impairing its heat radiation characteristic and which can avoid an increase in its production costs and degradation in its maintainability and which can be eco-friendly. The electronic device cabinet is composed of a frame-shaped side cover made of an ABS (Acrylonitrile Butadiene Styrene) resin, a rectangular top cover made of, for example, aluminum mounted in an upper portion of the side cover in a freely detachable manner and a rectangular bottom cover made of, for example, aluminum mounted in a lower portion of the side cover in a freely detachable manner.

20 Claims, 8 Drawing Sheets

FIG. 13

ELECTRONIC DEVICE CABINET

BACKGROUND OF THE INVENTION

1. Field of the Invention

The present invention relates to an electronic device cabinet and more particularly to the electronic device cabinet used to house parts that tend to generate a large amount of heat.

2. Description of the Related Art

Various electronic devices including a liquid crystal projector, personal computer or a like are fabricated by using desired electronic parts such as an LSI (Large Scale Integrated circuit). To manufacture such electronic devices, a cabinet, an electronic device cabinet used to house and mechanically hold the electronic devices and to provide an electrical connection is required. A conventional electronic device is composed of an insulating material including a resin, metal or a combination of resin and metal.

In recent years, as parts or components to be housed in the electronic device cabinet increase in performance, electronic devices are being made highly functional as well. For example, a liquid crystal projector has become highly functional by employing a high-intensity lamp, and a personal computer also has become highly sophisticated by mounting, for example, a high-speed MPU (Micro Processing Unit).

As electronic devices become highly functional, heat produced in the electronic device cabinet due to such highly functional components including the high-intensity lamp, high-speed MPU or like, becomes a problem. Therefore, in order to lengthen useful life of housed electronic devices and to improve their reliability, it is important to take an effective measure for ensuring heat radiation within the electronic device cabinet.

Conventionally, in order to dissipate such heat produced within the electronic device cabinet outside, a fan is used, as a heat radiation method, which is mounted within the electronic device cabinet. In addition, to improve heat radiation efficiency by using the fan, a comparatively large-sized fan that can provide a sufficient volume of air is required.

On the other hand, in the liquid crystal projector, personal computer or like, it is required that they are not only compact and lightweight for achieving portability and energy-saving but also highly functional in order to maintain their high performance. To meet these requirements, it is inevitably required that the electronic device cabinet itself should be compact and lightweight. However, if the electronic device cabinet has to be compact and lightweight, there is no choice but to sacrifice space within the electronic device cabinet itself and therefore it is impossible to mount the comparatively large-sized fan that can provide the sufficient volume of air within the electronic device cabinet. As a result, there remains a risk of reduction in heat radiating characteristic in the electronic device cabinet.

To solve this problem, a method for achieving effective heat radiation is proposed which can provide sufficient heat radiation effects even in limited space having a small area in the electronic device cabinet. That is, a heat sink or heat pipe made of metal being excellent in thermal conductivity, for example, aluminum, is conventionally attached, as heat radiation device, to highly functional parts such as the high-intensity lamp, high-speed MPU or the like which are main heat producing sources within the electronic device cabinet. Moreover, when a part, at least, of the electronic device cabinet is constructed from metals. The metal include aluminum, magnesium alloy or a like which are excellent in thermal conductivity.

Since heat produced in the electronic device cabinet is dissipated outside by introducing such heat radiation devices made of metal being excellent thermal conductivity as described above, the electronic device cabinet can be made compact and lightweight without degradation of heat radiation efficiency. When the heat radiation device is constructed from such metal being excellent in thermal conductivity, since its structure becomes complicated, an increase in production costs is inevitable. Due to a complicated structure of the heat radiation device, it takes much time to assemble or disassemble the electronic device cabinet, causing a reduction in its maintainability. Moreover, if the electric device cabinet is composed of metal being excellent in thermal conductivity, the electronic device cabinet itself becomes heated, in a handy-type electronic device in particular, thus interfering with its portability.

Furthermore, in recent years, designing enabling products to be eco-friendly from a viewpoint of general environmental problems that are global in scope is required for various electronic devices as well. That is, it is required that electronic devices including the liquid crystal projector and personal computer described above should be designed so that they can be reused or recycled after being disposed of. In other words, it is required that products should be designed so that they can be easily assembled and disassembled when reused or recycled and that use of parts composed of a combination of composite materials should be minimized as much as possible. It is also required that a part should be constructed in a form of a module to make its life long and to reuse it. Such designing practices for electronic devices described above should be also applied to the electronic device cabinet.

The conventional electronic device cabinet is successfully made compact and lightweight without degradation in the heat radiation efficiency. However, there remain problems in that an increase in production costs and degradation in maintainability are inevitable, therefore making it difficult to design the electronic device cabinet to be very eco-friendly. That is, as described above, in the conventional electronic device cabinet, since the heat radiation device made of metal being excellent in thermal conductivity is attached to the heat producing sources themselves within the electronic device cabinet, sufficient heat radiation effects can be achieved even in limited space and the electronic device cabinet can be made compact and lightweight without degradation in heat radiation characteristic. However, in many cases, structure of such heat radiation devices is inevitably complicated, thus causing the increase in production costs and decrease in maintainability. Moreover, when the electronic device cabinet is designed so as to be eco-friendly in consideration of future reuse or recycling, an increase in weight of components constituting the electronic device cabinet is inevitable, thus causing a high cost as well.

SUMMARY OF THE INVENTION

In view of the above, it is an object of the present invention to provide an electronic device cabinet which can be made compact and lightweight without degradation in heat radiation efficiency and can avoid an increase in its production costs and a decrease in its maintainability and which can be easily designed so as to be eco-friendly, easily reused or recycled.

According to a first aspect of the present invention, there is provided an electronic device cabinet for housing desired parts containing electronic parts constituting an electronic device, the electronic device cabinet including:

an intermediate frame body made of insulating materials;
an upper covering body composed of metal or alloy mounted in an upper portion of an intermediate frame body in a freely detachable manner;
a lower covering body composed of metal or alloy mounted in a lower portion of the intermediate frame body in a freely detachable manner.

In the foregoing, a preferable mode is one wherein the upper covering body has an approximately rectangular or square shape; and the lower covering body has an approximately rectangular or square shape.

In the foregoing mode wherein the upper covering body has an approximately rectangular shape; and the lower covering body has an approximately rectangular shape, a further preferable mode is one wherein the intermediate frame body has both side faces extending in a longitudinal direction and both side faces extending in a traverse direction and wherein two or more fitting nails are mounted in a lower portion of both side faces extending in the longitudinal direction and two or more approximately L-shaped guide grooves in an upper portion of both side faces extending in the traverse direction.

Also, a preferable mode is one wherein the approximately rectangular lower covering body has both side faces extending in the longitudinal direction and both side faces are bent upward in an approximately L-shaped form and wherein two or more fitting holes corresponding to the fitting nails mounted on the intermediate frame body are formed at both side faces and further wherein the lower covering body is attached to the intermediate frame body by fitting the fitting nails into the fitting holes.

Also, a preferable mode is one wherein the upper covering frame has both side faces extending in the longitudinal direction and both side faces are bent downward in an approximately L-shaped form and wherein two or more fitting hooks corresponding to the approximately L-shaped guide grooves formed on the intermediate frame body and further wherein the upper covering body is attached to the intermediate frame body by fitting the fitting hooks into the guide grooves and then by sliding the fitting hooks along the guide grooves.

Also, a preferable mode is one wherein the intermediate frame body is integrally molded using resins.

Also, a preferable mode is one wherein an air intake port and an air exhaust port are formed on both side faces extending in the traverse direction of the intermediate frame body.

Also, a preferable mode is one wherein, in a corner of the intermediate frame body, a thin plate portion is formed by partially making thin plates constituting both side faces extending in the longitudinal direction and in the traverse direction.

Also, a preferable mode is one wherein two or more slide guides are formed on an inner side of the intermediate frame body and wherein two or more compartment plates used to partition space in the intermediate frame body are attached to the slide guide in a freely detachable manner.

Also, a preferable mode is one wherein a binding portion composed of positioning nails and positioning pins used to fix parts to be housed is mounted on the intermediate frame body.

Also, a preferable mode is one wherein the binding portion is mounted at a plurality of places for every part to be housed.

Furthermore, a preferable mode is one wherein the positioning nails are disposed in the vicinity of the positioning pins within the intermediate frame body.

BRIEF DESCRIPTION OF THE DRAWINGS

The above and other objects, advantages and features of the present invention will be more apparent from a following description taken in conjunction with accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
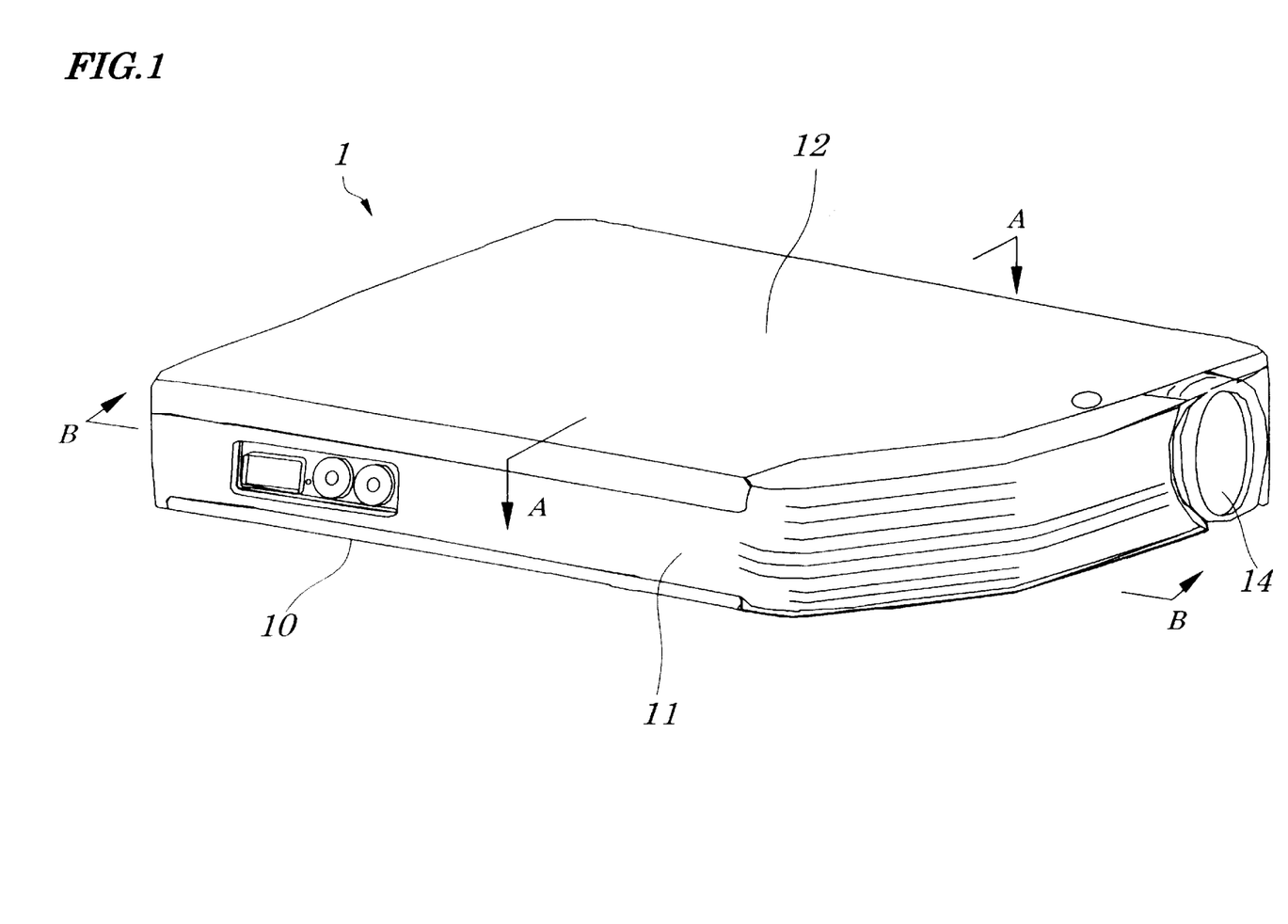
FIG. 1 is a perspective view showing configurations of an electronic device cabinet according to one embodiment of the present invention.
Figure 2:
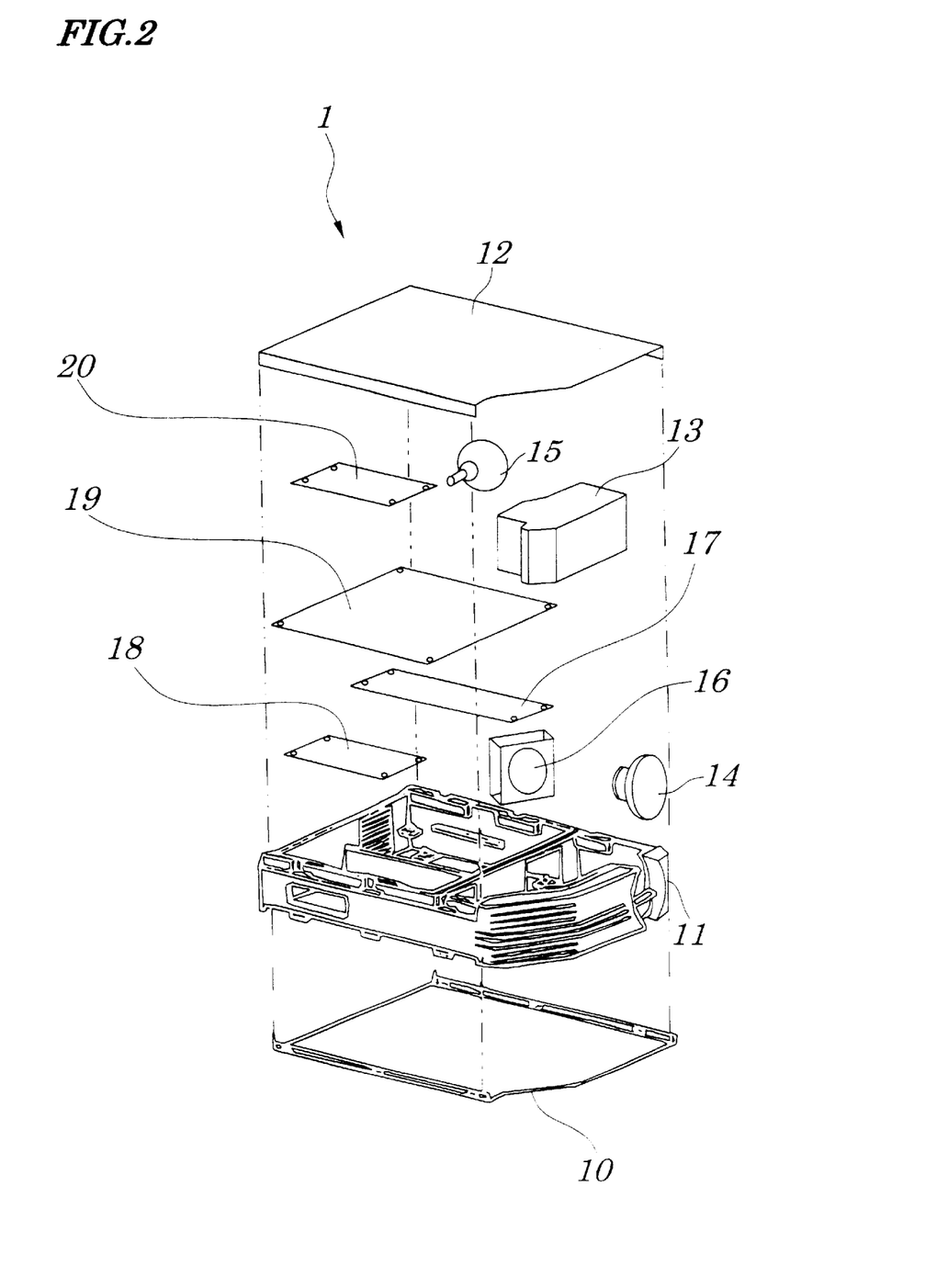
FIG. 2 is an exploded perspective view showing configurations of the electronic device cabinet of FIG. 1.
Figure 3:
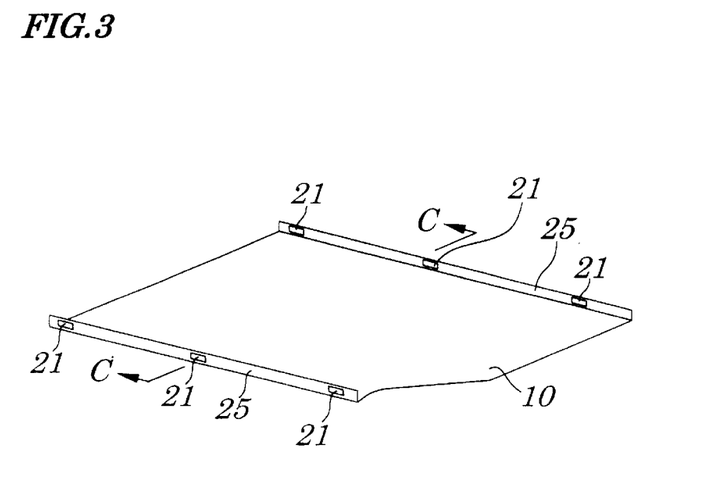
FIG. 3 is a perspective view showing a bottom cover of the electronic device cabinet of FIG. 1.
Figure 4:
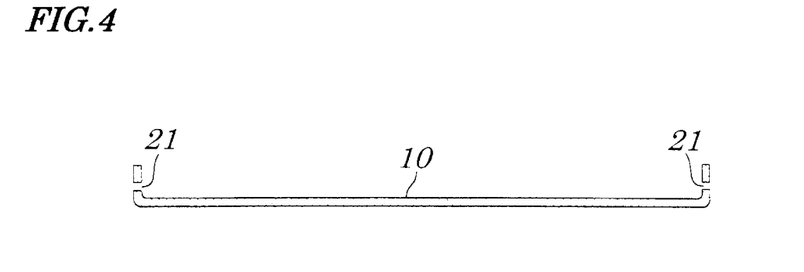
FIG. 4 is a cross-sectional view of the bottom cover in FIG. 3 taken along a line C—C.
Figure 5:
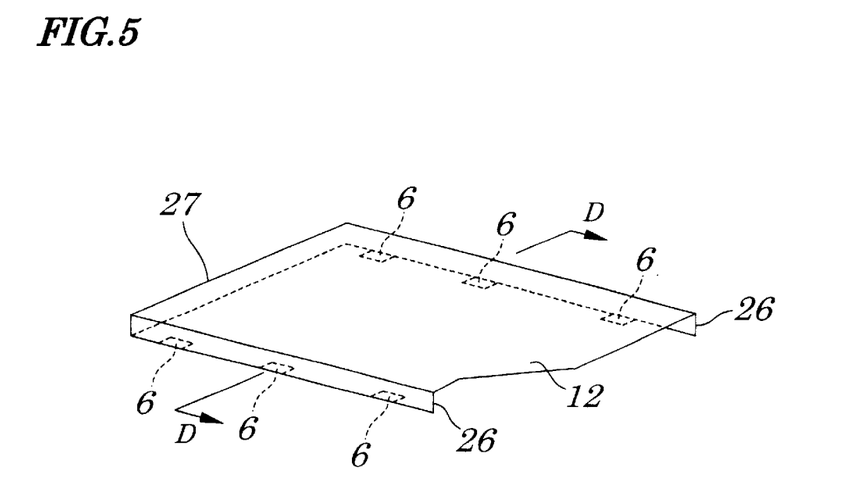
FIG. 5 is a perspective view showing a top cover of the electronic device cabinet of FIG. 1.
Figure 6:
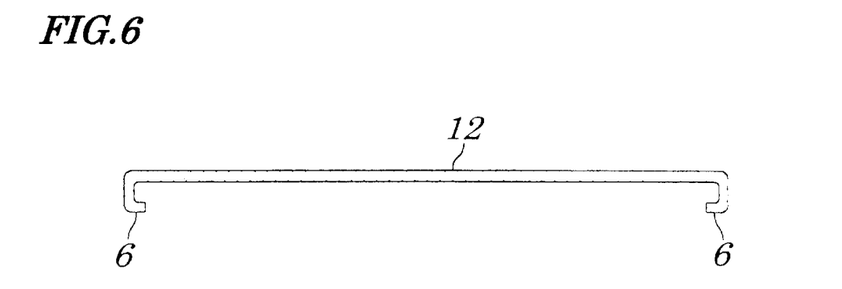
FIG. 6 is a cross-sectional view of the top cover of FIG. 5 taken along a line D—D.
Figure 7:
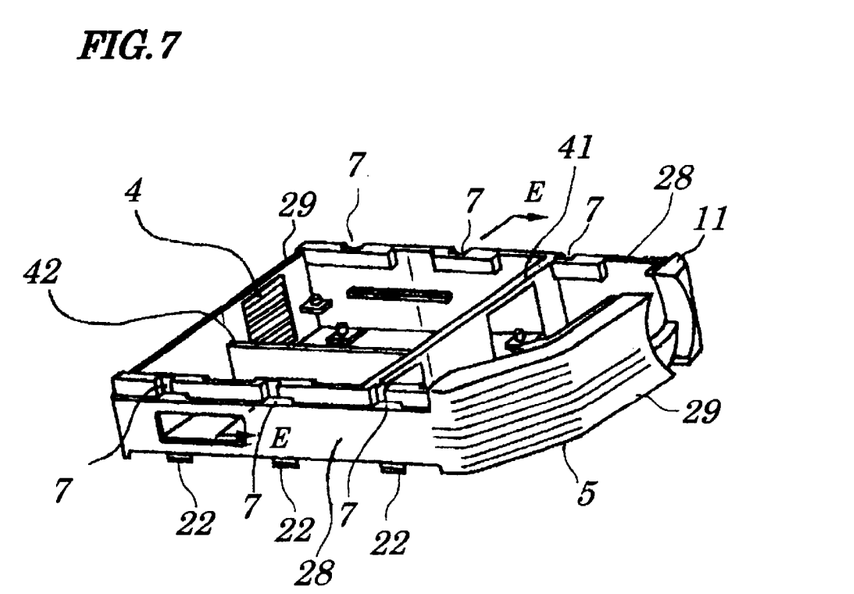
FIG. 7 is a perspective view of a side cover of the electronic device cabin FIG. 1.
Figure 8:
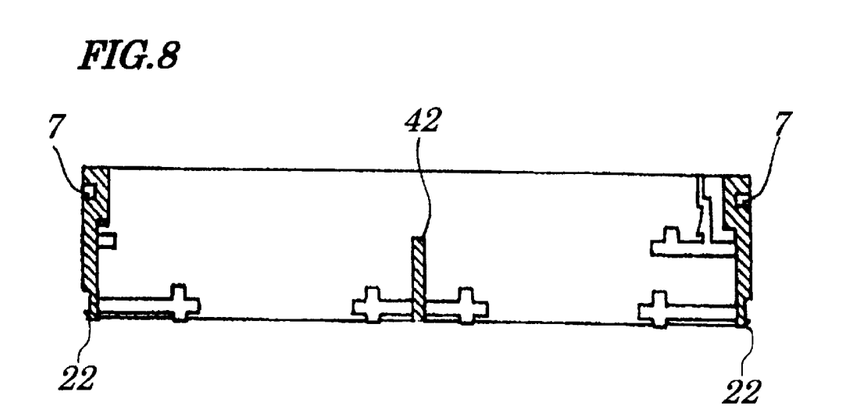
FIG. 8 is a cross-sectional view of the side cover of FIG. 7 taken along a line E—E.
Figure 9:
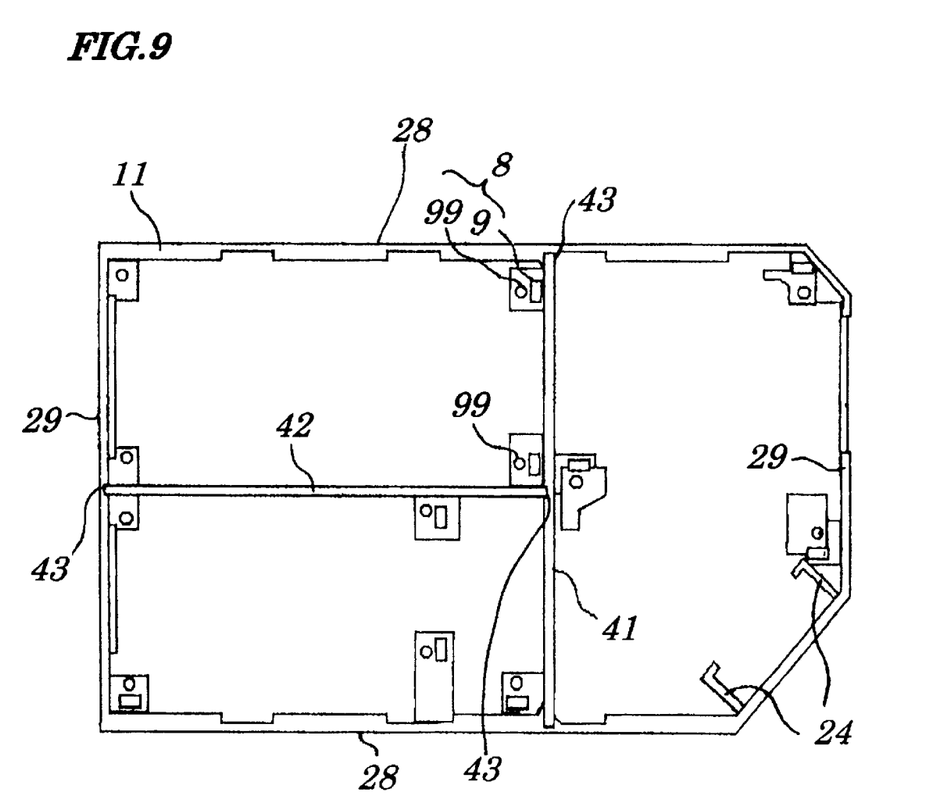
FIG. 9 is a top view of the side cover of FIG. 7.
Figure 10:
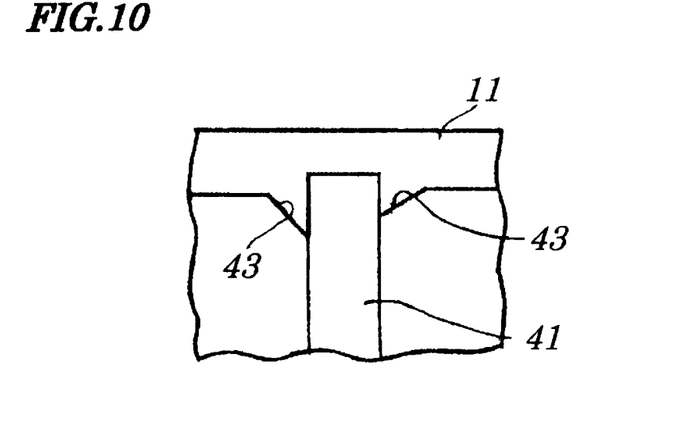
FIG. 10 is a side view showing a part of the side cover of FIG. 7.
Figure 11:
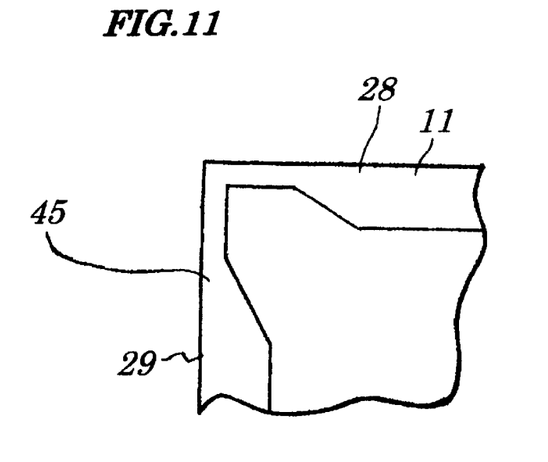
FIG. 11 is a top view showing a corner portion of the side cover of FIG. 7.
Figure 12:
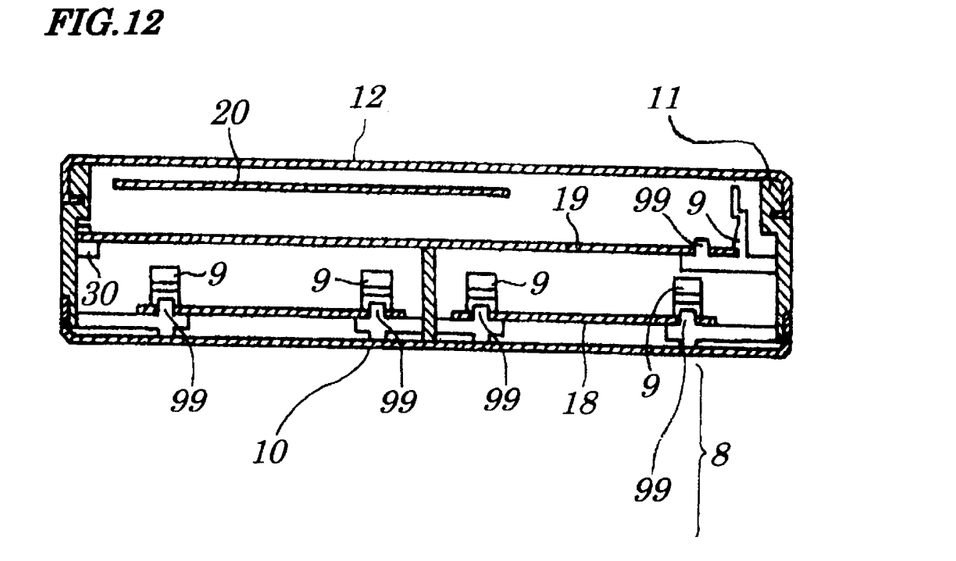
FIG. 12 is a cross-sectional view of the electronic device cabinet of FIG. 1 taken along a line A—A.
Figure 13:
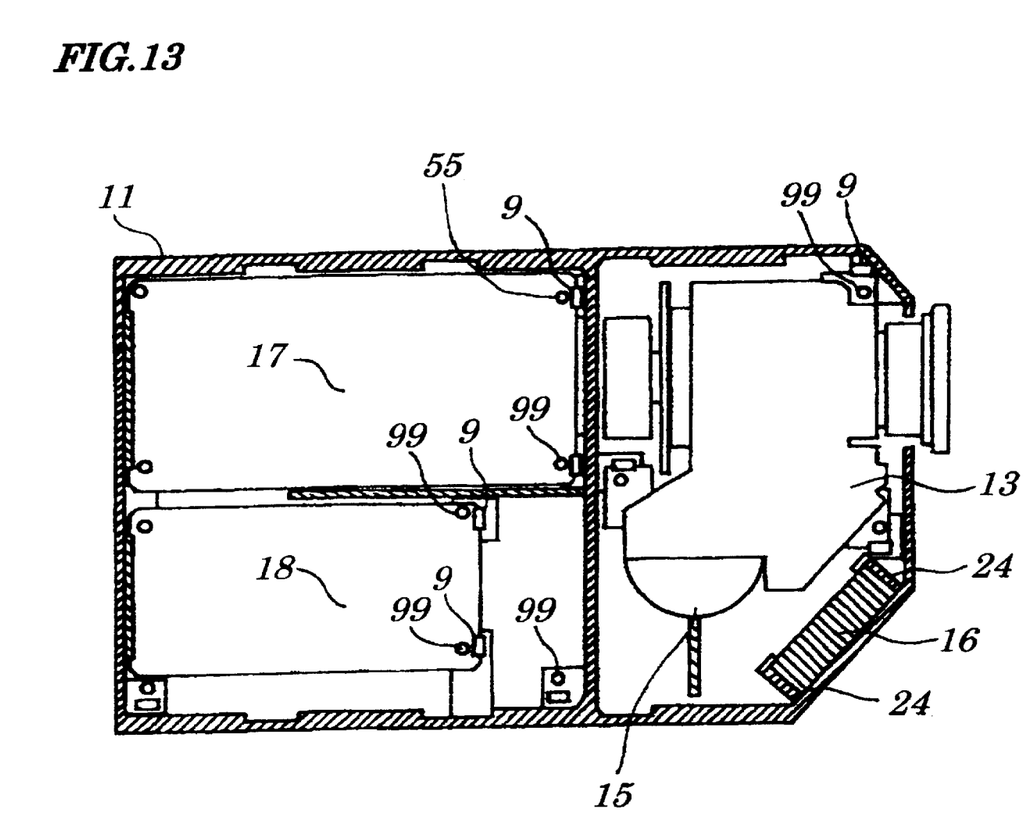
FIG. 13 is a cross-sectional view of the electronic device cabinet of FIG. 1 taken along a line B—B.

FIG. 1 is a perspective view showing configurations of an electronic device cabinet according to one embodiment of the present invention. FIG. 2 is an exploded perspective view showing configurations of the electronic device cabinet of FIG. 1. FIG. 3 is a perspective view showing a bottom cover of the electronic device cabinet of FIG. 1. FIG. 4 is a cross-sectional view of the bottom cover in FIG. 3 taken along a line C—C. FIG. 5 is a perspective view showing a top cover of the electronic device cabinet of FIG. 1. FIG. 6 is a cross-sectional view of the top cover of FIG. 5 taken along a line D—D. FIG. 7 is a perspective view of a side cover of the electronic device cabinet of FIG. 1. FIG. 8 is a cross-sectional view of the side cover of FIG. 7 taken along a line E—E. FIG. 9 is a top view of the side cover of FIG. 7. FIG. 10 is a side view showing a part of the side cover of FIG. 7. FIG. 11 is a top view showing a corner portion of the side cover of FIG. 7. FIG. 12 is a cross-sectional view of the electronic device cabinet of FIG. 1 taken along a line A—A. FIG. 13 is a cross-sectional view of the electronic device cabinet of FIG. 1 taken along a line B—B.

According to the embodiment of the present invention, as shown in FIGS. 1 and 2, the electronic device cabinet 1 is composed of a frame-shaped side cover 11 (an intermediate frame body) made of ABS (Acrylonitrile Butadiene Styrene) resin, a rectangular top cover 12 (an upper covering body) made of, for example, aluminum, mounted to the side cover 11 in a freely detachable manner and a rectangular bottom cover 10 (a lower covering body) made of, for example, aluminum, mounted in a lower portion of the side cover 11 in a freely detachable manner.

In the embodiment, an example is described in which a liquid crystal projector and its necessary parts are housed in the electronic device cabinet 1.

As depicted in FIG. 2, the liquid crystal projector housed in the electronic device cabinet 1 is chiefly composed of an optical unit 13, a lens 14, a lamp 15, a cooling fan 16, a power source board 17, a ballast board 18, a main board 19, a sub board 20 or a like. In FIG. 1, a state is shown in which a part of the lens 14 out of components constituting the electronic device cabinet 1 is exposed from a front side of the electronic device cabinet 1. Configurations of the bottom cover 10, the top cover 12 and the side cover 11 will be hereafter described in detail.

The bottom cover 10, as shown in FIGS. 3 and 4, is made of aluminum and formed in a rectangular shape, both side faces 25 of which are bent upward in an L-shaped form. Fitting holes 21 being, for example, three holes are provided on both side faces 25 of the bottom cover 10 so that fitting nails 22 formed in the lower portion of the side cover 11 are fitted into these fitting holes 21. The bottom cover 10, to make it lightweight, is formed so as to have a plate with a thickness being 0.8 to 1.0 mm.

As shown in FIGS. 5 and 6, the top cover 12 is composed of the same aluminum plate with a thickness being 0.8 to 1.0 mm as that for the bottom cover 10 and formed in a rectangular shape. Both side face 26 and side face 27 formed on the top cover extending in a longitudinal direction and in a traverse direction are both bent downward in an L-shaped form. Moreover, fitting hooks 6 having a width being 5 mm to 10 mm, for example, three hooks are provided in an inner portion of both side faces 26 formed on the top cover extending in the longitudinal direction. The fitting hooks 6 are fitted into L-shaped guide grooves 7 mounted in the upper portion of the side cover 11, which is described later.

As shown in FIGS. 7 to 9, the side cover 11 is made of ABS resin and formed in a frame-like shape, which constitutes main portions of the electronic device cabinet 1 together with the bottom cover 10 and the top cover 12. The side cover 11 is constructed by four side faces including both side faces 28 extending in the longitudinal direction and both side faces 29 in the traverse direction, using a plate, with a thickness being 2.0 mm to 3.0 mm in order to obtain a sufficient mechanical strength as the electronic device cabinet 1, formed in one piece of the ABS resin.

In the lower portions of both side faces 28 of the side cover 11, three fitting nails 22 are formed so that they can fit into the fitting holes 21, while, in the upper portions of both side faces 28 of the side cover 11, three L-shaped guide grooves 7 are formed so that they can fit into fitting hooks 6. Moreover, an air intake port 4 is provided on one side of a rear side face out of both side faces 29 formed at the side cover 11 in a traverse direction and an air exhaust port 5 is provided on an other of a front side face out of both side faces 29 formed at the side cover 11 extending in the traverse direction. As described above, since the air intake port 4 and the air exhaust port 5 are provided at both side faces 29, facing each other, in the side cover 11, when heat produced in the electronic device cabinet 1 is dissipated outside, resistance against a flow of air to be used for heat radiation is made small, thus making heat radiation more effective. If the electronic device cabinet having such configurations as described above is applied to the liquid crystal projector in particular, high heat radiating efficiency can be obtained, because the lens 14 is disposed on the front face of the side cover 11 and the optical unit 13 and the lamp 15 inevitably being main heat producing sources are positioned in the vicinity of the lens 14.

Within the side cover 11, a detachable compartment plate 41 constructed from resin is provided in a traverse direction and a detachable compartment plate 42 constructed from resin is provided in a longitudinal direction. These compartment plates 41 and 42 are mounted in a manner in which parts can be effectively housed and in a manner in which space in the side cover 11 is partitioned. As shown in FIG. 10, inside of both side faces 28 of the side cover 11, a slide guide 43 is provided in advance and the compartment plate 41 is inserted from top along the slide guide 43. The slide guide 43 as described above is provided inside the side face 29 on a rear side of the side cover 11 and the compartment plate 42 is inserted from topd along the slide guide 43. Each of the compartment plates 41 and 42 is easily removed by pulling them upward along the slide guide 43.

In the corner of the side cover 11, as shown in FIG. 11, a thin plate portion 45 is formed by partially making thin plates constituting both side faces 28 extending in the longitudinal direction and both side faces 29 extending in the traverse direction. The corner of the side cover 11 is easily deformed.

By configuring as above, when the electronic device cabinet 1 is disassembled, by deforming and then folding the side cover 11 in the thin plate portion 45 after removing each of the compartment plates 41 and 42, the side cover 11 can avoid an excessive occupation of space within the electronic device cabinet 1 while being held, which, as a result, allows the area of the side cover 11 to be reduced. If the side cover 11 is to be disposed of, it may be separated from the thin plate portion 45.

To the side cover 11 are formed binding sections 8 composed of positioning nails 9 and positioning pins 99 used to fix each part to be housed within the liquid crystal projector when each part being an electronic device is housed therein. The positioning pins 99 are provided so as to be corresponding to positioning holes 55 of each part of the electronic device and so as to be fitted into the positioning holes 55. At this point, the positioning nails 9 are preferably mounted near to the positioning pins 99 so that each of the electronic devices can be easily disassembled or assembled. The binding section 8 composed of positioning nails 9 and positioning pins 99 is positioned at a plurality of places for every part depending on a shape and weight of the part to be housed. Moreover, a guide 30 and L-shaped fixing hook 24 are mounted within the side cover 11 and are used to facilitate for housing when parts are housed.

Next, a method for assembling the electronic device cabinet 1 will be described below by referring to FIGS. 7 to 9 and FIGS. 12 and 13.

By positioning the fitting nails 22 mounted in lower portions of the side cover 11 into the fitting holes 21 of the corresponding bottom cover 10, the bottom cover 10 is attached tightly to the side cover 11. The fitting nails 22 of the side cover 11, by bending them, are easily positioned into the fitting holes 21 accordingly.

Then, the optical unit 13 is pressed downward into an inside position on a front of the side cover 11 in a manner that three positioning holes 55 of, for example, the optical unit 13 remains contacted to positioning pins 99 of the side cover 11. This procedure also causes positioning pins 99 to be inserted into positioning holes 55 and the optical unit 13 to be fixed to the side cover 11 in a manner that positioning nails 9 disposed in the vicinity of the positioning pins 99 are inserted into the optical unit 13 with it being deformed.

The power source board 17 is then inserted downward into the inside position on the front of the side cover 11 in a manner that one side of the power source board 17 is contacted to the guide 30 of the side cover 11 and two positioning holes 55 of, for example, the power source board 17 remain contacted to positioning pins 99 of the side cover 11. This procedure causes positioning pins 99 to be inserted into the positioning holes 55 and the power source 17 to be fixed to the side cover 11 in a manner that the positioning nails 9 disposed in the vicinity of positioning pins 99 are inserted into the power source board 17 with it being deformed. By the same methods as described above, the sub board 20, main board 19 and ballast board 18 are fixed to the side cover 11.

The cooling fan 16 is then fixed to the inside position on the front of the side cover 11 by inserting the cooling fan 16 downward with it contacted to L-shaped fixing hooks 24 to position the cooling fan 16 between the fixing hooks 24. Moreover, the cooling fan 16 may be fixed by using the binding section 8 composed of the positioning nails 9 and positioning pins 99, without using the L-shaped fixing hooks 24.

After the fitting hook 6 for fixing the top cover 12 is fitted into the L-shaped guide groove 7 in the upper portion of the side cover 11, the top cover 11 is attached to the side cover 11 by sliding the top cover 12 along the guide groove 7. Thus, by attaching the top cover 12 to the side cover 11 by performing two procedures of fitting and sliding, the top cover 12 can be fixed completely to the side cover 11. By the above assembling processes, as shown in FIGS. 12 and 13, fabrication of the electronic device cabinet 1 is now complete.

The electronic device cabinet 1 is assembled without using any of external parts such as screws and therefore no tools are required for assembling. This enables a great improvement of working efficiency. Moreover, since the electronic device cabinet 1 can be disassembled in reverse order of how it was assembled, it is easy to disassemble.

As described above, in the electronic device cabinet 1 of the embodiment, by forming the side cover 11 used to fix parts constituting the electronic device using resins, sufficient mechanical strength is obtained and furthermore by forming both the bottom cover 10 and the top cover 12 using aluminum being excellent in thermal conductivity, sufficient heat radiation efficiency is obtained. Since the aluminum used as the material can be made so thin that it can function as the bottom cover 10 and top cover 12, it is possible to make the electronic device cabinet 1 lightweight accordingly. Moreover, the electronic device cabinet 1 is constructed by combining three parts including the side cover 11, bottom cover 10 and top cover 12, thus providing simple construction and allowing simple assembly and disassembly. As a result, an increase in production costs for the electronic device cabinet 1 can be avoided and its maintainability is improved. Also, as described above, since the number of parts is small, designing eco-friendly products is made possible.

Thus, according to the present invention, the electronic device cabinet 1 is constructed using the frame-shaped side cover 11 made of the ABS resin, the rectangular top cover 12 made of, for example, aluminum mounted in the upper portion of the side cover 11 in a freely detachable manner and the rectangular bottom cover 10 made of, for example, aluminum mounted in the lower portion of the side cover 11 in a freely detachable manner. The electronic device cabinet 1 is composed of the intermediate frame body made of insulating materials, the upper covering body made of metal or an alloy mounted in the upper portion of the intermediate frame body in a freely detachable manner and the lower covering body made of metal or an alloy mounted in the lower portion of the intermediate frame body in a freely detachable manner, thus enabling the electronic device cabinet to have its simplified structure.

Therefore, according to the present invention, the electronic device cabinet can be easily designed which can be made compact and lightweight without impairing its heat radiation characteristic and which can avoid the increase in its production costs and degradation in its maintainability and further which can be eco-friendly.

It is apparent that the present invention is not limited to the above embodiments but may be changed and modified without departing from the scope and spirit of the invention. For example, in the embodiment described above, aluminum is used as the material for the bottom cover and top cover, however, an aluminum alloy may be used as well. Other metals including magnesium, iron, lead, zinc, copper, silver, gold, nickel, cobalt, chromium, titanium, tin, alloy thereof or a like may be employed. The side cover may be made of, not only the ABS resin, but also other resins including a polycarbonate resin. Not only resins but also insulating substances such as ceramics may be used as the material for the side cover. Of course, the shape of the top cover or bottom cover unit is also not limited to that of a rectangle Especially, when each part constituting the liquid crystal projector is housed in the electronic device cabinet, it is desired that the optical unit, the lamp or the like being a part which tends to produce much heat is directly contacted with the top cover or the side cover. Moreover, to increase the heat radiation capability, a fin or heat sink used to increase a surface area coming into contact with air may be mounted to the top cover or side cover. The thickness of the plate used as the side cover, bottom cover or top cover provided in the embodiment is only an example and it can be changed depending on purposes, applications, types of materials or a like.

Finally, the present application claims the priorities of Japanese Patent Application Nos. Hei11-143295 and 2000-128586 filed on May 24, 1999 and Mar. 24, 2000 respectively, which are herein incorporated by references.

What is claimed is:

1. An electronic device cabinet for housing desired parts including electronic parts constituting an electronic device, said electronic device cabinet comprising:

a side covering made of insulating material and serving as an intermediate frame body;

an upper covering body composed of metal or an alloy mounted in an upper portion of said side covering body in a freely detachable manner;

and a lower covering body composed of metal or an alloy mounted in a lower portion of said side covering body in a freely detachable manner.

2. The electronic device cabinet according to claim 1, wherein said upper covering body has an approximately rectangular shape; and said lower covering body has an approximately rectangular shape.

3. The electronic device cabinet according to claim 2, wherein said side covering body has both side faces extending in a longitudinal direction and both side faces extending in a traverse direction and wherein two or more fitting nails are mounted in a lower portion of said both side faces extending in said longitudinal direction and two or more approximately L-shaped guide grooves in an upper portion of said both side faces extending in said longitudinal direction.

4. The electronic device cabinet according to claim 2, wherein said lower covering body has both side faces extending in a longitudinal direction and said both side faces are bent upward in an approximately L-shaped form and wherein two or more fitting holes corresponding to said fitting nails mounted on said side covering body are formed at said both side faces and further wherein said lower covering body is attached to said side covering body by fitting said fitting nails into said fitting holes.

5. The electronic device cabinet according to claim 2, wherein said upper covering frame has both side faces extending in a longitudinal direction and said both side faces are bent downward in an approximately L-shaped form and wherein two or more fitting hooks corresponding to said approximately L-shaped guide grooves formed on said side covering body and further wherein said upper covering body is attached to said side covering body by fitting said fitting hooks into said guide grooves and then by sliding said fitting hooks along said guide grooves.

6. The electronic device cabinet according to claim 2, wherein said side covering body is integrally molded using resins.

7. The electronic device cabinet according to claim 2, wherein an air intake port and an air exhaust port are formed on said both faces extending in said traverse direction of said side covering body.

8. The electronic device cabinet according to claim 2, wherein, in a corner of said side covering body, a thin plate portion is formed by partially making thin plates constituting said both side faces extending in said longitudinal direction and in said traverse direction.

9. The electronic device cabinet according to claim 2, wherein two or more slide guides are formed on an inner side of said side covering body and wherein two or more compartment plates used to partition space in said side covering body are attached to said slide guide in a freely detachable manner.

10. The electronic device cabinet according claim 2, wherein a binding portion composed of positioning nails and positioning pins used to fix parts to be housed is mounted on said side covering body.

11. The electronic device cabinet according to claim 10, wherein said binding portion is mounted at a plurality of places for every part to be housed.

12. The electronic device cabinet according to claim 10, wherein said positioning nails are disposed in the vicinity of said positioning pins within said side covering body.

13. The electronic device cabinet according to claim 1, wherein said upper covering body has an approximately square shape; and said lower covering body has an approximately square shape.

14. The electronic device cabinet according to claim 13, wherein said side covering body has both side faces extending in one direction and wherein two or more fitting nails are mounted in a lower portion of said both side faces extending in said one direction and two or more approximately L-shaped guide grooves in an upper portion of said both side faces extending in said one direction.

15. The electronic device cabinet according to claim 13, wherein said lower covering body has both side faces extending in one direction and said both side faces are bent upward in an approximately L-shaped form and wherein two or more fitting holes corresponding to said fitting nails mounted on said side covering body are formed at said both side faces and further wherein said lower covering body is attached to said side covering body by fitting said fitting nails into said fitting holes.

16. The electronic device cabinet according claim 13, wherein said upper covering body has both side faces extending in one direction and said both side faces are bent downward in an approximately L-shaped form and wherein two or more fitting hooks corresponding to said approximately L-shaped guide grooves formed on said side covering body and further wherein said upper covering body is attached to said side covering body by fitting said fitting hooks into said guide grooves and then by sliding said fitting hooks along said guide grooves.

17. The electronic device cabinet according to claim 13, wherein said side covering body is integrally molded using resins.

18. The electronic device cabinet according to claim 13, wherein an air intake port and an air exhaust port are formed on said both faces extending in said traverse direction of said side covering body.

19. The electronic device cabinet according to claim 13, wherein, in a corner of said side covering body, a thin plate portion is formed by partially making thin plates constituting said both side faces extending in said one direction and in said traverse direction.

20. The electronic device cabinet according claim 13, wherein two or more slide guides are formed on an inner side of said side covering body and wherein two or more compartment plates used to partition space in said side covering body are attached to said slide guide in a freely detachable manner.

* * * * *